Oct. 20, 1959 C. HUSSON 2,909,705

CONTROL CIRCUIT

Filed May 29, 1958

WITNESSES:

Bernard R. Gieguey

Myron E. Click

INVENTOR

Charles Husson

BY

F. E. Browder

ATTORNEY

United States Patent Office 2,909,705

Patented Oct. 20, 1959

2,909,705

CONTROL CIRCUIT

Charles Husson, Elmira, N.Y., assignor to Westinghouse Electric Corporation, East Pittsburgh, Pa., a corporation of Pennsylvania Application May 29, 1958, Serial No. 738,714

5 Claims. (Cl. 315—168)

This invention relates to control circuits in general and in particular to excitation means for ignitron rectifiers or inverters, or for other controlled tubes.

The advent of a hyperconductive semiconductor transistor switch has led to many new electronic applications. These hyperconductive transistor switches comprise either a P–N–P or an N–P–N structure, with an associated mass-of-metal attached to one of the zones having P-type conductivity in the former, or to one of the zones having N-type conductivity in the latter structure, and a base contact ohmically affixed to the intermediate zone in either structure. Electrical leads are connected to the first conductivity zones in either type of structure to the base contact and to the mass-of-metal.

This hyperconductive transistor switch functions in a unique manner. If a reverse potential is applied to a circuit between the mass-of-metal and the first conductive zone, with no voltage being applied to the base contact, the hyperconductive transistor will be so highly resistant that up to a predetermined point, less than a milliunit of current will flow even at a substantial number of voltage units. However, as the number of negative voltage units is increased, there is reached the point at which a critical current and voltage is applied and the semiconductor transistor device will suddenly become hyperconductive so that a potential of approximately one voltage unit will sustain a high current of up to approximately 10 current units. This hyperconductive point may be varied in any particular hyperconductive transistor switch so as to occur at, for example, 45 voltage units to 150 voltage units reverse potential. By applying a small biasing potential to the base contact, the hyperconductive breakdown point can be controlled so as to occur at lower reverse potential and current. A biasing current of the order of from 1 to 3 milliunits of current will be effective to cause hyperconductive breakdown to occur as desired.

Such a hyperconductive semiconductor transistor switch is described in a copending application Serial No. 649,038, entitled "Semiconductor Transistor Switches," filed March 28, 1957, assigned to the same assignee as the present invention. For a more detailed description of the construction, characteristics and operation of such a hyperconductive semiconductor transistor switch, reference is made to the above mentioned copending application Serial No. 649,038.

Another example of a controlled semiconductor rectifier having a gating electrode that will function in the manner described above is referenced in Control Engineering, March 1958, page 132.

It is an object of this invention to provide an improved control circuit for firing electrical discharge tubes.

It is a further object of this invention to provide an improved control circuit or excitation means for firing electrical discharge devices utilizing a hyperconductive semiconductor transistor switch wherein said control circuit has the inherent qualities of reliability, maintenance-free operation, and a reduction in size when compared to prior firing control circuits.

Further objects of this invention will become apparent when the following description is taken in conjunction with the accompanying drawings. In said drawings, for illustrative purposes only, are illustrated preferred embodiments of this invention.

Figure 1:
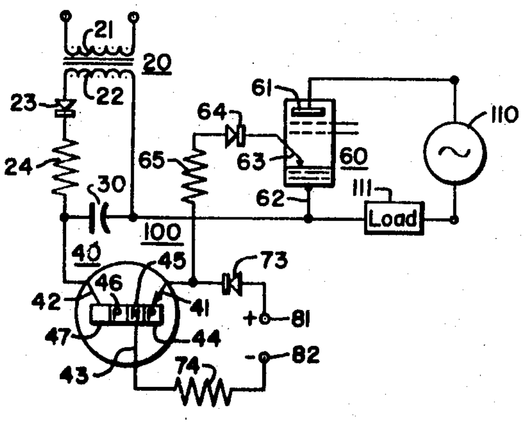
Figure 1 is a schematic diagram illustrating the control circuit for firing an electric discharge tube.

Referring to Fig. 1, the apparatus illustrated comprises in general an energy storage device 30, a hyperconductive transistor switch 40 and an electrical discharge device 60. The energy storage means 30 and the hyperconductive transistor switch 40 with its means for receiving a bias or firing signal combine to perform as an excitation means 100 for said ignitron 60.

The hyperconductive transistor switch 40 comprises an emitter 44, a first base member 45, a second base member 46 and a mass-of-metal 47 in intimate contact with the second base member 46. In addition, there are provided two terminal electrodes 41 and 42 for making electrical connection with the emitter 44 and mass-of-metal 47, respectively. The electrode 43 provides for making electrical contact with the first base element 45.

The electrical discharge tube 60, an ignitron being used as an example, comprises an anode 61, a cathode 62 and an ignitor 63; said ignitor 63 and said cathode 62 comprising the control circuit for firing said ignitron 60. A main supply 110 and a load 111 are shown connected in series between the anode 61 and cathode 63 in the illustrative embodiment.

A charging transformer 20 having a primary winding 21 and a secondary winding 22 is connected to charge the energy storage means 30, shown in Fig. 1 as a capacitor means, through a half-wave rectifier means 23 and a resistor 24. A pulsating electrical source, not shown, is to be connected to the primary winding 21.

The energy storage means 30 is connected between the ignitor 63 and the cathode 62 of the ignitron 60 through the terminal electrodes 42, 41 circuit of the hyperconductive semiconductor switch 40 and a rectifier means 64. A bias terminal 81 is connected to the terminal electrode 42 through a rectifier 73. A bias terminal 82 is connected to the base electrode 43 through a resistor 74.

Figure 3:
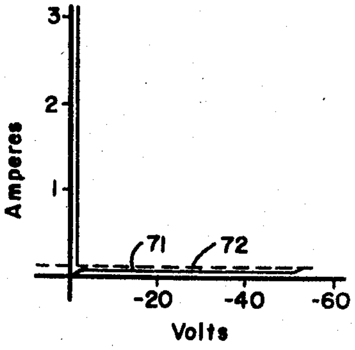
Fig. 3 is a diagram of a curve plotting the operating characteristics of a hyperconductive semiconductor transistor switch of the type utilized in this invention.

Referring to Fig. 3, it may be seen that the hyperconductive transistor switches are highly resistant to the flow of current when reverse voltages below the breakdown voltage are impressed across the emitter and mass-of-metal members. The hyperconductive transistor switch for which the curve 71 was plotted had no current applied to the base contact by the biasing circuit, and it became highly conductive or hyperconductive when a potential of −55 voltage units and about 1 milliunit of current was applied, such that the voltage dropped along the line 72 to a value of approximately 1 voltage unit at which it supported a relatively high current flow in current units. Thus the hyperconductive transistor switch when subjected to predetermined operating conditions abruptly becomes a conductor with low ohmic resistance. The hyperconductive transistor switch 40, hereinbefore described, will respond to different operating conditions. When connected in a circuit, the voltage impressed across the emitter 44 and mass-of-metal 47 and the biasing current delivered to the first base member cooperate in rendering this hyperconductive transistor switch highly conductive at a selected reverse current and voltage. As the base biasing current is increased, the reverse voltage at which the hyperconductive transistor switch 40 becomes highly conductive becomes lower, while if the base biasing current is decreased, the voltage at which it becomes highly conductive is increased.

The voltage across the energy storage means 30 will be smaller in magnitude than the rated breakdown voltage of the hyperconductive transistor switch 40. Thus when a firing signal is supplied to the biasing input terminals 81 and 82, so that the terminal 81 is at a positive potential with respect to the terminal 82, the breakdown voltage of the hyperconductive switch 40 will be abruptly lowered below the value of the voltage stored across the capacitive means 30. Thus, current will flow through the terminal electrode 42, terminal electrode 41 circuit of the hyperconductive switch 40 to the ignitor 63 of the ignitron 60 and will cause the ignitron 60 to fire providing a voltage of proper magnitude is impressed upon its anode 61-cathode 62 circuit. The ignitron 60 then acts as a conversion apparatus for interchanging electric energy between two different electric systems, at least one of said systems being an alternating current system.

The diodes 64 and 73, while not completely necessary at all times, may be utilized to prevent reverse currents from flowing in the circuits with which they are associated. The resistors 24, 65 and 74 are current limiting resistors. The transformer 20 and the rectifying means 23 are merely indicative of a number of different ways to provide electrical energy to be stored upon the electrical energy storing means 30.

Figure 2:
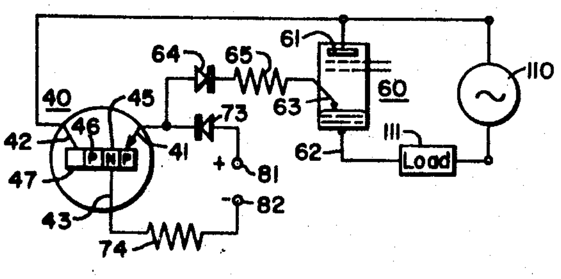
Fig. 2 is a schematic diagram of a second embodiment of this invention.

Referring to Fig. 2, there is illustrated a second embodiment of the teachings of this invention, in which like components of Figs. 1 and 2 have been given the same reference characters. The main distinction between the apparatus illustrated in Figs. 1 and 2 is that in Fig. 2 the apparatus has been connected for anode firing of the ignitron 60. That is, the energy storing means 30 is now eliminated. Energy for firing the ignitor 63 is drawn from the main supply 110 and applied to the ignitor 63 through the terminal electrode 42, 41 circuit of the hyperconductive semiconductor switch 40.

Since the operation of the apparatus illustrated in Fig. 2 is essentially the same as the operation of the apparatus illustrated in Fig. 1, a description of such operation is deemed unnecessary.

A control circuit for firing electrical discharge tubes when utilizing the invention described herein is more reliable, gives maintenance-free operation, and is smaller in size than prior art circuits because of the novel use of the included components and their circuit arrangements.

In conclusion, it is pointed out that while the illustrated examples constitute practical embodiments of my invention, I do not limit myself to the exact details shown, since modification of the same may be varied without departing from the spirit and scope of this invention.

I claim as my invention:

1. A conversion apparatus for interchanging electric energy between two different electric systems; at least one of said systems being an alternating current system; said apparatus comprising at least one tube having a main anode-cathode circuit and a control circuit; circuit connections for connecting the main anode-cathode circuit of each tube between the systems for energy interchange therebetween; excitation means connected to said control circuit of said tube comprising means supplying firing energy for said control circuit, hyperconductive transistor switching means having three electrodes, circuit means connecting said means supplying said firing energy and two of said three electrodes of said hyperconductive transistor switching means and said control circuit in series, and means for applying a firing signal between a third electrode and one of said two electrodes of said hyperconductive transistor switching means.

2. A conversion apparatus for interchanging electric energy between two different electric systems; at least one of said systems being an alternating current system; said apparatus comprising at least one tube having a main anode-cathode circuit and a control circuit; circuit connections for connecting the main anode-cathode circuit of each tube between the systems for energy interchange therebetween; excitation means connected to said control circuit of said tube comprising means supplying firing energy for said control circuit, hyperconductive transistor switching means having three electrodes, circuit means serially connecting said means supplying said firing energy and two of said three electrodes of said hyperconductive transistor switching means in series with said control circuit, and means for applying a firing signal through rectifier means between a third electrode and one of said two electrodes of said hyperconductive transistor switching means.

3. A conversion apparatus for interchanging electric energy between two different electric systems; at least one of said systems being an alternating current system; said apparatus comprising at least one tube having a main anode-cathode circuit and a control circuit; circuit connections for connecting the main anode-cathode circuit of each tube between the systems for energy interchange therebetween; excitation means connected to said control circuit of said tube comprising means supplying firing energy for said control circuit, hyperconductive transistor switching means having three electrodes, circuit means serially connecting said means supplying firing energy and two of said three electrodes of said hyperconductive transistor switching means in series with said control circuit, and means for applying a firing signal through rectifier means and current limiting means between a third electrode and one of said two electrodes of said hyperconductive transistor switching means.

4. A conversion apparatus for interchanging electric energy between two different electric systems; at least one of said systems being an alternating current system; said apparatus comprising at least one tube having a main anode-cathode circuit and a control circuit; circuit connections for connecting the main anode-cathode circuit of each tube between the systems for energy interchange therebetween; excitation means connected to said control circuit of said tube comprising an electrical energy storage means having capacitive means being charged through transformer means, resistor means and current limiting means, hyperconductive transistor switching means having three electrodes, circuit means serially connecting said energy storage means and two of said three electrodes of said hyperconductive transistor switching means in series with said control circuit, and means for applying a firing signal through rectifier means and current limiting means between a third electrode and one of said two electrodes of said hyperconductive transistor switching means.

5. A conversion apparatus for interchanging electric energy between two different electric systems; at least one of said systems being an alternating current system; said apparatus comprising at least one tube having a main anode-cathode circuit and a control circuit; circuit connections for connecting the main anode-cathode circuit of each tube between the systems for energy interchange therebetween; excitation means connected through rectifier means to said control circuit of said tube comprising an electric energy storage means having capacitive means being charged through transformer means, resistor means and current limiting means, hyperconductive transistor switching means having three electrodes, circuit means serially connecting said energy storage means and two of said three electrodes of said hyperconductive transistor switching means in series with said control circuit, and means for applying a firing signal through rectifier means and current limiting means between a third electrode and one of said two electrodes of said hyperconductive transistor switching means.

References Cited in the file of this patent

UNITED STATES PATENTS 2,242,894 Lyle ------------------ May 20, 1941

2,306,229 Somerville -------------- Dec. 22, 1942
2,320,790 Moyer ----------------- June 1, 1943

FOREIGN PATENTS 914,286 Germany --------------- June 28, 1954
1,116,412 France ------------------ Feb. 6, 1956